United States Patent
Ito et al.

(10) Patent No.: US 7,097,946 B2
(45) Date of Patent: Aug. 29, 2006

(54) PHOTOMASK, METHOD OF MANUFACTURING A PHOTOMASK, AND METHOD OF MANUFACTURING AN ELECTRONIC PRODUCT

(75) Inventors: Sachiyo Ito, Yokohama (JP);
Masamitsu Itoh, Yokohama (JP);
Masahiko Hasunuma, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 323 days.

(21) Appl. No.: 10/615,194

(22) Filed: Jul. 9, 2003

(65) Prior Publication Data

US 2004/0072082 A1    Apr. 15, 2004

(30) Foreign Application Priority Data

Jul. 9, 2002    (JP) .............................. 2002-199918

(51) Int. Cl.
*G03F 9/00* (2006.01)
*G03C 5/00* (2006.01)
(52) U.S. Cl. .............................. 430/5; 430/30; 430/311
(58) Field of Classification Search .................... 430/5, 430/311, 30
See application file for complete search history.

(56) References Cited

U.S. PATENT DOCUMENTS

2002/0061452 A1    5/2002 Nozawa et al.

FOREIGN PATENT DOCUMENTS

JP    2002-162727    2/2002

*Primary Examiner*—Christopher G. Young
(74) *Attorney, Agent, or Firm*—Finnegan, Henderson, Farabow, Garrett & Dunner, L.L.P.

(57) ABSTRACT

A photomask comprises a substrate, a translucent film selectively formed on the substrate, and a shading film selectively formed on the translucent film, wherein when the substrate, the translucent film and the shading film have Young's moduli (MPa) $E_0$, $E_1$ and $E_2$, and film thickness (m) $d_0$, $d_1$ and $d_2$ respectively, internal stresses (MPa) of the translucent film and the shading film at room temperature are $s_1$ and $s_2$ respectively, a covering rate by the translucent film defined by an area in which the shading film is not formed is expressed as h, and coefficients are expressed as $k_1 = 1.3 \times 10^{-8}$, $k_2 = -9.5 \times 10^{-2}$, $k_3 = 6.0 \times 10^{-7}$, and $k_4 = -5.2 \times 10^{-2}$ respectively, the substrate, the translucent film and the shading film satisfy a condition given by the following expression:

$$\left| \frac{1}{E_0 \cdot d_0} \cdot \left\{ h \cdot \left( k_1 \cdot \frac{S_1}{E_1 \cdot d_1} + k_2 \right) + \left( k_3 \cdot \frac{S_2}{E_2 \cdot d_2} + k_4 \right) \right\} \right| \leq 1.4 \times 10^{-4} (m^{-1}).$$

20 Claims, 3 Drawing Sheets

PHOTOMASK, METHOD OF MANUFACTURING A PHOTOMASK, AND METHOD OF MANUFACTURING AN ELECTRONIC PRODUCT

CROSS-REFERENCE TO RELATED APPLICATIONS

This application is based upon and claims the benefit of priority from the prior Japanese Patent Application No. 2002-199918, filed Jul. 9, 2002, the entire contents of which are incorporated herein by reference.

BACKGROUND OF THE INVENTION

1. Field of the Invention

The present invention relates to a photomask having a desired flatness, a method of manufacturing such a photomask, and a method of manufacturing an electronic product.

2. Description of the Related Art

In recent years, various problems are becoming apparent in lithographic steps used in semiconductor manufacturing processes. As the dimensions of semiconductor devices have been scaled down, the demand has increased for finer pattern lithography. The device design rules have already scaled down to 0.13 μm. As a result of this, the pattern dimensions must be controlled with a very strict accuracy of the order of 10 nm.

Under such a circumstance, one factor preventing higher accuracy in pattern formation steps is the degrees of flatness of photomasks used in lithographic steps. With further shrinking of dimensions, the margin for the depth of focus in lithographic steps decreases. Under this circumstance, the degrees of flatness of photomasks has become non-negligible.

In general, the photomask is formed by depositing a translucent film and a shading film on a substrate of quartz. The translucent film has a large internal stress in excess of 1 GPa. This internal stress deforms the quartz substrate, deteriorating the flatness of the photomask. The deterioration of the flatness has constituted the prime cause of poor yield.

The translucent film and the shading film deposited on the substrate of quartz are etched into a desired mask pattern, whereby the photomask manufacturing process is completed. It is difficult to predict the deformation of the substrate after mask pattern formation from the internal stresses that the translucent and shading films have at the time of deposition; therefore, the flatness of the photomask cannot be controlled.

BRIEF SUMMARY OF THE INVENTION

In an aspect of the present invention, there is provided a photomask comprising a substrate, a translucent film selectively formed on the substrate, and a shading film selectively formed on the translucent film, wherein when the substrate, the translucent film and the shading film have Young's moduli (MPa) $E_0$ $E_1$ and $E_2$, and film thickness (m) $d_0$, $d_1$ and $d_2$ respectively, internal stresses (MPa) of the translucent film and the shading film at room temperature are $s_1$ and $s_2$ respectively, a covering rate by the translucent film defined by an area in which the shading film is not formed is expressed as h, and coefficients are expressed as $k_1=1.3\times10^{-8}$, $k_2=-9.5\times10^{-2}$, $k_3=6.0\times10^{-7}$, and $k_4=-5.2\times10^{-2}$ respectively, the substrate, the translucent film and the shading film satisfy a condition given by the following expression:

$$\left| \frac{1}{E_0 \cdot d_0} \cdot \left\{ h \cdot \left( k_1 \cdot \frac{S_1}{E_1 \cdot d_1} + k_2 \right) + \left( k_3 \cdot \frac{S_2}{E_2 \cdot d_2} + k_4 \right) \right\} \right| \leq 1.4 \times 10^{-4} (m^{-1}).$$

In another aspect of the invention, there is provided a method of manufacturing a photomask comprising forming a translucent film and a shading film sequentially onto a surface of a substrate, measuring an internal stress in each of the translucent film and the shading film, determining whether or not a following expression is satisfied when the substrate, the translucent film and the shading film have Young's moduli (MPa) $E_0$ $E_1$ and $E_2$, and film thickness (m) $d_0$, $d_1$ and $d_2$ respectively, internal stresses (MPa) of the translucent film and the shading film at room temperature are $s_1$ and $s_2$ respectively, a virtual covering rate by the translucent film after mask pattern formation defined by an area in which the shading film is not formed is expressed as h, coefficients are expressed as $k_1=1.3\times10^{-8}$, $k_2=-9.5\times10^{-2}$, $k_3=6.0\times10^{-7}$, and $k_4=-5.2\times10^{-2}$ respectively, and a predicted warping amount for a desired photomask after the mask pattern formation is defined as A ($m^{-1}$), and $$\left| \frac{1}{E_0 \cdot d_0} \cdot \left\{ h \cdot \left( k_1 \cdot \frac{S_1}{E_1 \cdot d_1} + k_2 \right) + \left( k_3 \cdot \frac{S_2}{E_2 \cdot d_2} + k_4 \right) \right\} \right| \leq A(m^{-1})$$

removing the translucent film and the shading film selectively to be the covering rate h that satisfy the expression based on the determination result.

In still another aspect of the invention, there is provided a method of manufacturing an electronic product comprising forming a photoresist on a substrate to be processed, passing light through a photomask having a mask pattern that has a substrate, a translucent film selectively formed on the substrate and a shading film selectively formed on the translucent film to transfer the mask pattern onto the photoresist; wherein when the substrate, the translucent film and the shading film have Young's moduli (MPa) $E_0$ $E_1$ and $E_2$, and film thickness (m) $d_0$, $d_1$ and $d_2$ respectively, internal stresses (MPa) of the translucent film and the shading film at room temperature are $s_1$ and $s_2$ respectively, a covering rate by the translucent film defined by an area in which the shading film is not formed is expressed as h, and coefficients are expressed as $k_1=1.3\times10^{-8}$, $k_2=-9.5\times10^{-2}$, $k_3=6.0\times10^{-7}$, and $k_4=-5.2\times10^{-2}$ respectively, the substrate, the translucent film and the shading film satisfy a condition given by the following expression:

$$\left| \frac{1}{E_0 \cdot d_0} \cdot \left\{ h \cdot \left( k_1 \cdot \frac{S_1}{E_1 \cdot d_1} + k_2 \right) + \left( k_3 \cdot \frac{S_2}{E_2 \cdot d_2} + k_4 \right) \right\} \right| \leq 1.4 \times 10^{-4} (m^{-1}).$$

developing the photoresist, and selectively processing the substrate to be processed using the photoresist as a mask.

BRIEF DESCRIPTION OF THE SEVERAL VIEWS OF DRAWING

DETAILED DESCRIPTION OF THE INVENTION

The embodiments of the present invention will be described hereinafter with reference to the accompanying drawings.

[First Embodiment]

Figure 1:
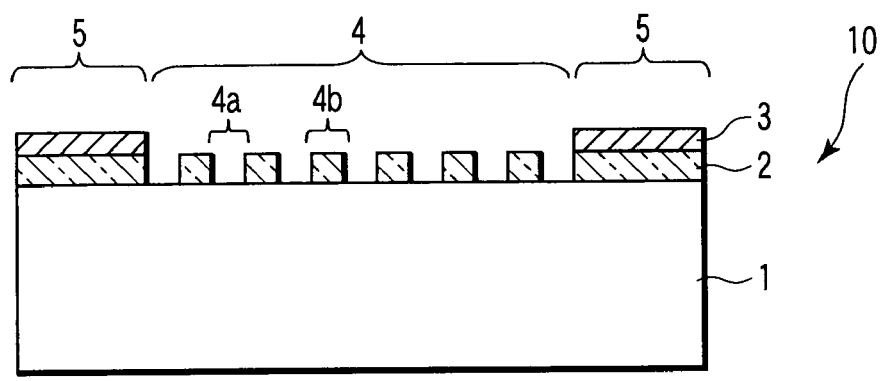
FIG. 1 is a longitudinal section of a photomask according to a first embodiment of the present invention.

FIG. 1 is a longitudinal section of a photomask according to a first embodiment of the present invention. As shown in FIG. 1, the photomask, indicated generally at 10, comprises a substrate 1 of quartz, a translucent film 2, and a shading film 3. The translucent film 2 and the shading film 3 are deposited on the quartz substrate 1 in the order mentioned.

The quartz substrate 1 is a transmission substrate which is square in shape and measures 152 mm on a side and about 6 mm in thickness. The translucent film 2 comprises, say, MoSiON (hereinafter referred simply to as MoSi) and is selectively formed on the quartz substrate 1 at a thickness of about 95 nm. The shading film 3 comprises, say, Cr and is selectively formed on the translucent film 2 at a thickness of about 59 nm.

In FIG. 1, an area indicated at 4 is a pattern formed area and an area indicated at 5 is a peripheral area. In the pattern formed area 4 is formed a circuit pattern to be transferred onto a wafer. The peripheral area 5 is formed in the periphery of the pattern formed area 4 to surround it and covered with the shading film 3. Thus, unwanted patterns in other than the pattern formed area can be prevented from being transferred onto the wafer.

In the first embodiment, the rate, h, of covering is used as one of the values representing characteristics of the photomask. A covering rate h refers to the rate at which the substrate 1 is covered with the translucent film 2 in the area where the shading film 3 is not formed and is defined by $h=W_2/W_1$ where $W_1$ is the total area of the pattern formed area 4 and $W_2$ is the area occupied by the translucent film 2 that covers the quartz substrate 1 in the pattern formed area 4.

The pattern formed area 4 comprises transmission portions 4a and semi-transmission portions 4b. The transmission portions 4a comprises only the quartz substrate 1. The semi-transmission portions 4b comprises the quartz substrate 1 and the translucent film 2. The semi-transmission film 2 functions as a phase shifting layer. The phase shifting function of the semi-transmission film causes the phase of light that passes through the transmission portions 4a (for example, the light transmittance is about 100%) and the phase of light that passes through the semi-transmission portions 4b (for example, the light transmittance is about 6%) to differ from each other (for example, by 180 degrees), which allows the pattern formed in the area 4 to be transferred onto the surface of the wafer.

Here, let the quartz substrate 1, the translucent film 2 and the shading film 3 be $E_0$, $E_1$, and $E_2$, respectively, in Young's modulus (MPa) and $d_0$, $d_1$, and $d_2$, respectively, in thickness (m). Let the internal stresses of the translucent film 2 and the shading film 3 at room temperature (say, 25° C.) be $s_1$ and $s_2$, respectively. The covering rate by the translucent film 2 after the formation of mask pattern is defined as h. Furthermore, let constants $k_1$, $k_2$, $k_3$ and $k_4$ be $k_1=1.3\times10^{-8}$, $k_2=-9.5\times10^{-2}$, $k_3=6.0\times10^{-7}$, and $k_4=-5.2\times10^{-2}$.

From consideration of relationships between mask substrates different in internal stress and the covering rates, we found that the following relationship exists between the aforementioned parameters and the radius of curvature, R, which serves as a index of the amount of warping of the substrate after the mask pattern formation:

$$\frac{1}{R} = \frac{1}{E_0 \cdot d_0} \cdot \left\{ h \cdot \left( k_1 \cdot \frac{S_1}{E_1 \cdot d_1} + k_2 \right) + \left( k_3 \cdot \frac{S_2}{E_2 \cdot d_2} + k_4 \right) \right\} \quad (1)$$

The absolute value of 1/R in equation (1), i.e., the amount of warping of the substrate, is set such that $|1/R| \leq 1.4\times10^{-4}$ (m$^{-1}$). This allows the flatness of the photomask after mask pattern formation to be kept at 0.8 μm or less. The flatness refers to the distance between a highest position and a lowest position.

The photomask of the present embodiment is therefore formed through the use of the quartz substrate 1, the translucent film 2 and the shading film 3 which have such parameters as satisfy equation (1).

Figure 2A:
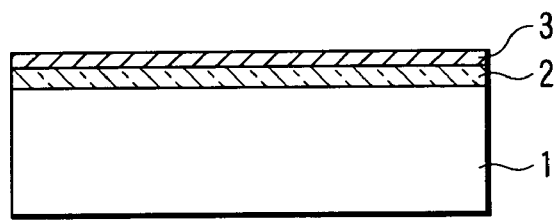
FIGS. 2A, 2B and 2C are sectional views, in the order of manufacturing steps of the photomask according to the first embodiment.
Figure 2B:
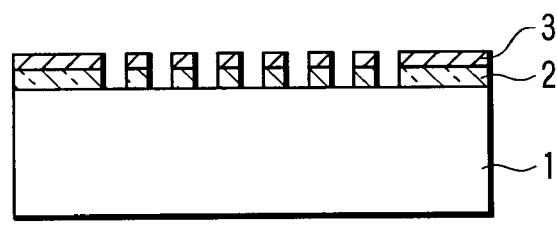
Figure 2C:
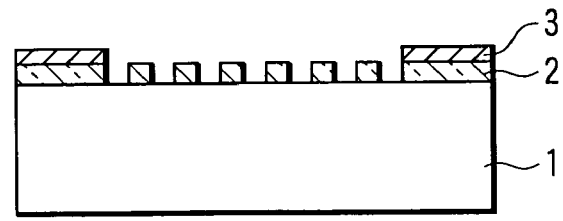

FIGS. 2A, 2B and 2C are sectional views, in the order of steps of manufacture, of the photomask shown in FIG. 1.

As shown in FIG. 2A, first, the translucent film 2 and the shading film 3 are formed sequentially onto the surface of the quartz substrate 1. Specifically, on the surface of the quartz substrate 1 which is, for example, 152 mm on a side and about 6 mm in thickness, the translucent film 2 comprising MoSi is formed at a thickness of, say, 95 nm by means of sputtering. Next, the shading film 3 comprising Cr is formed on the translucent film 2 at a thickness of, say, 59 nm by means of sputtering. Thereby, a half-tone mask blank is formed which is of the stacked structure of the quartz substrate 1, the translucent film 2 and the shading film 3.

In the sputtering of Cr to form the shading film 3, the pressure of an Ar gas is set at 11 mTorr higher than 5 mTorr, the commonly used gas pressure. The internal stresses of the translucent film 2 and the shading film 3 deposited in such a manner as described above were measured via X-ray diffraction. More specifically, the interplanar spacing of each of the MoSi and Cr films was measured through X-ray diffraction and the internal stress was calculated using the $\sin^2 \phi$ method. As a result, for the Cr film, the internal stress was 2100 MPa in the direction of tension and for the MoSi film, the internal stress was 1400 MPa in the direction of compression.

Next, for the half-tone mask blank fabricated in the above manner, we found the values of 1/R using equation (1) for the case where the covering rate h by the translucent film 2 is 30%, 50%, 70%, or 100%. The calculations are indicated in Table 1.

TABLE 1

| MoSi film | | | Cr film | | | | 1/R | Flatness | |
| --- | --- | --- | --- | --- | --- | --- | --- | --- | --- |
| Young's modulus (GPa) | Thickness (nm) | Internal stress (MPa) | Young's modulus (GPa) | Thickness (nm) | Internal stress (MPa) | Covering rate | (calculated value) ($m^{-1}$) | (measured value) (μm) | Mask production yield |
| 275 | 95 | −1400 | 255 | 59 | 2100 | 0.3 | $6.66 \times 10^{-6}$ | 0.04 | OK |
| 275 | 95 | −1400 | 255 | 59 | 2100 | 0.5 | $-3.53 \times 10^{-5}$ | 0.20 | OK |
| 275 | 95 | −1400 | 255 | 59 | 2100 | 0.7 | $-7.72 \times 10^{-5}$ | 0.45 | OK |
| 275 | 95 | −1400 | 255 | 59 | 2100 | 1 | $-1.40 \times 10^{-4}$ | 0.80 | OK |

As shown in Table 1, $|1/R| \leq 1.4 \times 10^{-4} (m^{-1})$ resulted for any covering rate. We therefore confirmed that desired photomasks could be produced if the covering rate was set in the range from 30 to 100%.

Next, a layer of positive chemically amplified resist is coated onto the surface of the shading film 3 of the resultant half-tone mask blank at a thickness of about 500 nm. Using an electron beam lithography system having an acceleration voltage of about 50 keV, a 1 G DRAM pattern with a hole size in the 0.6 μm design rule was then drawn. The 0.6 μm hole size is the value on the mask. When the transfer magnification of the photomask is four, the 0.6 μm hole size corresponds to about 0.13 μm on the wafer. After pattern drawing, the resultant structure was baked for 15 min at 110° C. and then subjected to spray development with an alkaline developer solution to form a resist pattern. In this resist pattern formation process, four types of patterns such that their respective covering rates are 30%, 50%, 70%, and 100% were formed. When the covering rate is 100%, there is no need of drawing any pattern by the electron beam lithography system.

Next, as shown in FIG. 2B, using the resist pattern as a mask, both the shading film 3 and the translucent film 2 were etched by means of reactive ion etching techniques. A mixture of chlorine and oxygen gases is used as the etching gas. After that, the resist layer was stripped off by ashing equipment and the mask was then cleaned by a cleaning machine. Next, the shading film 3 in the pattern formed area 4 was etched away by means of wet etching. In this manner, the half-tone phase shifting masks having covering rates of 30%, 50%, 70% and 100% were obtained (FIG. 2C). The areas where both the shading film 3 and the translucent film 2 were etched away correspond to the transmission portions 4a comprising the quartz substrate 1 only. The areas where only the shading film 3 was etched away correspond to the semitransmission portions 4b where the translucent film 3 is left on the quartz substrate 1.

The flatness of each of the half-tone phase shifting masks having covering rates of 30%, 50%, 70% and 100% manufactured in accordance with the aforementioned method was measured by an optical interferometer. The measurements are indicated in Table 1. As can be seen from Table 1, the flatness is kept at 0.8 μm or less for any mask. Therefore, the margin for the depth of focus is allowed to increase in comparison with the prior art and the mask production yield can be expected to increase.

Reference is now made to FIGS. 3A through 3F to describe a method of manufacturing an electronic product using a half-tone phase shifting mask produced in accordance with the aforementioned manufacturing method.

In the description which follows, an example of manufacturing a semiconductor device as an electronic product will be described.

The outline of electronic product manufacturing steps is as follows.

First, a photoresist is formed on a substrate to be processed. Next, a mask pattern of a photomask that satisfies $|1/R| \leq 1.4 \times 10^{-4} (m^{-1})$ is transferred onto the photoresist by an exposure system. Next, the photoresist is developed and the substrate is selectively processed using the photoresist as a mask.

Hereinafter, the electronic product manufacturing steps will be described more specifically.

Figure 3A:
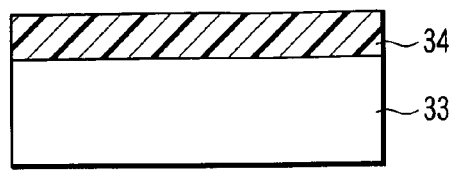
FIGS. 3A through 3F are sectional views illustrating a manufacturing steps of an electronic product using the half-tone phase shifting mask according to the first embodiment.
Figure 3B:
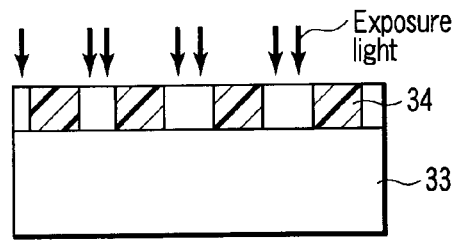
Figure 3C:
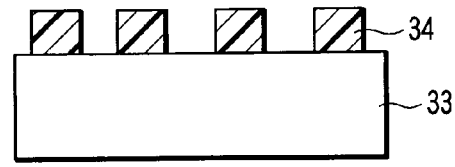
Figure 3D:
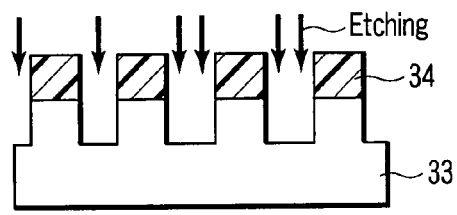

First, a substrate 33 to be processed is prepared which has been coated with a photoresist 34 (FIG. 3A). The substrate 33 to be processed may be any substrate on which a pattern is to be formed, such as a wafer itself, a wafer formed on top with a film or films, etc. Films formed on a wafer include semiconductor films, metal films, and insulating films. A photomask circuit pattern is transferred onto the substrate 33 using an exposure system (FIG. 3B).

Figure 4:
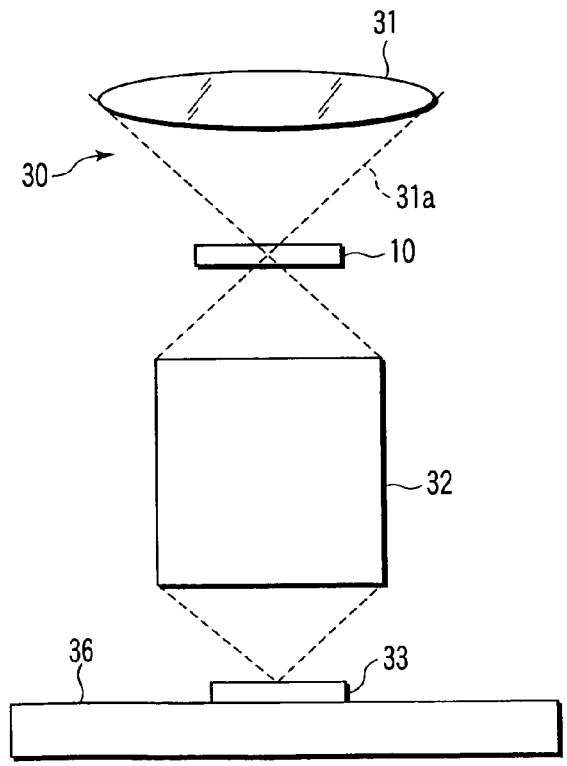
FIG. 4 shows an example of an exposure apparatus used in the first embodiment.

An exemplary configuration of the exposure system is illustrated in FIG. 4. In the exposure system 30 shown in FIG. 4, light 31a from an illumination optical system (light source) 31 is directed onto a photomask 10. The light 31a passed through the photomask 10 is directed onto the substrate 33 to be processed through a projection optical system 32. That is, the circuit pattern of the photomask 10 is imaged onto the photoresist 34 on the substrate 33 placed on a stage 36.

Figure 3E:

In the development process (FIG. 3C), the light-exposed portions of the photoresist 34 are dissolved with a solvent and the unexposed resist pattern is left. After the development process, the substrate 33 is baked for a given period of time at a given temperature. Next, the substrate is etched using the resist pattern as a mask (FIG. 3D), so that those exposed portions of the substrate 33 which are not covered with the photoresist 34 are selectively etched to a given depth. Thereby, the surface of the substrate 33 (including a film or films thereon) is processed into a shape corresponding to the resist pattern. After the termination of the etching process, the photoresist 34 is stripped off the substrate 33 by ashing using oxygen plasma and the resultant substrate is then cleaned (FIG. 3E).

Figure 3F:
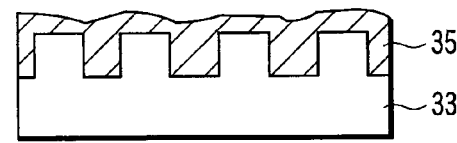

After the termination of the above photolithography and processing, a film of a semiconductor, a metal, or an insulator is formed on the substrate 33 (FIG. 3F). A CMP or etchback process is performed on the film 35 or on the film 35 and the substrate 33 for planarization. After that, the film 35 is processed through the same lithography process as described above. Further, the film formation and the film processing after the photolithography process are repeated in such a way that a new film is deposited on the resultant substrate and the film is then processed. Thereby, a semiconductor substrate formed with transistors, capacitors, electrodes, and interconnect lines is produced. A semiconductor part is finished by performing processes, such as dicing, mounting, bonding, sealing, etc., on the resultant semiconductor substrate.

The resultant semiconductor part is inspected through the use of an electron microscope and its characteristics, such as functions and performance, are inspected. These inspections confirmed that the production yield of semiconductor parts, such as DRAMs, could be increased significantly.

For comparison, the characteristics of a photomask produced by a conventional technique and the yield of semiconductor parts fabricated through the use of that photomask were measured.

A method of manufacturing a photomask using the conventional technique will be explained below.

First, on the surface of a quartz substrate 152 mm on a side and about 6 mm in thickness, a translucent film comprising MoSi was deposited at a thickness of 95 nm by means of sputtering. Next, a shading film comprising Cr was deposited on the translucent film at a thickness of 59 nm by means of sputtering. By measuring the deformations of interplanar spacing through X-ray diffraction, the internal stress in each of the MoSi and Cr films was measured. As a result, for the MoSi film, the internal stress was 1400 MPa in the direction of compression and for the Cr film, the internal stress was 0 MPa. The large internal stress in the MoSi film warped the resultant half-tone mask blank. The flatness of the mask blank was measured by an optical interferometer to be 1.9 μm.

A layer of positive chemically amplified resist is coated onto the surface of the half-tone mask blank at a thickness of 500 nm. A 1 GDRAM pattern with a hole size in the 0.6 μm design rule was then drawn. The 0.6 μm hole size is the value on the mask using an electron beam lithography system having an acceleration voltage of about 50 keV. When the transfer magnification of the photomask is four, the 0.6 μm hole size corresponds to about 0.13 μm on the wafer. After pattern drawing, the resultant structure was baked for 15 min at 110° C. and then spray developed with an alkaline developer solution, whereby a resist pattern was formed on the mask blank.

Next, using the resist pattern as a mask, both the MoSi film and the Cr film were etched by means of reactive ion etching techniques. As the etching gas use was made of a mixture of chlorine and oxygen gases. After that, the resist layer was stripped off the mask blank surface by ashing equipment and the mask was then cleaned by a cleaning machine. Next, the Cr film in the pattern formed area was etched away by means of wet etching. Thus, a half-tone phase shifting mask was produced.

In the mask thus produced the substrate deformation due to the internal stress in the MoSi film remains even after the pattern formation. The covering rate by the MoSi film on the mask varies with the pattern shape and the deformation of the substrate varies depending on the covering rate. Photomasks having MoSi covering rates of 30, 50, 70 and 100% were produced and their flatnesses were measured through the use of an optical interferometer. The measurements are indicated in Table 2 below.

TABLE 2

| MoSi film | | | Cr film | | | | 1/R | Flatness | |
|---|---|---|---|---|---|---|---|---|---|
| Young's modulus (GPa) | Thickness (nm) | Internal stress (MPa) | Young's modulus (GPa) | Thickness (nm) | Internal stress (MPa) | Covering rate | (calculated value) (m$^{-1}$) | (measured value) (μm) | Mask production yield |
| 275 | 95 | −1400 | 255 | 59 | 0 | 0.3 | −1.77 × 10$^{-4}$ | −1.02 | NG |
| 275 | 95 | −1400 | 255 | 59 | 0 | 0.5 | −2.19 × 10$^{-4}$ | −1.26 | NG |
| 275 | 95 | −1400 | 255 | 59 | 0 | 0.7 | −2.61 × 10$^{-4}$ | −1.51 | NG |
| 275 | 95 | −1400 | 255 | 59 | 0 | 1 | −3.24 × 10$^{-4}$ | −1.87 | NG |

The 1/R values obtained from equation (1) for those photomasks are also indicated in Table 2. The Young's modulus is 73 GPa for quartz substrate, 275 GPa for MoSi film, and 255 GPa for Cr film. For any covering rate, |1/R| exceeds $1.4 \times 10^{-4}$ and the flatness exceeds 0.8 μm. As can be seen from comparison with Table 1, the absolute value of the flatness is larger than in the present embodiment. As a result of manufacturing of semiconductor parts in accordance with the semiconductor part manufacturing method of the present embodiment using the photomask produced in accordance with the conventional method, the manufacturing yield reduced.

With the conventional technique, the amount of warping is known after the mask pattern has been formed. When, therefore, a photomask such that its amount of warping was too large to be used was produced, the mask pattern formation process went in vain. Under such a circumstance, means for predicting the amount of warping after mask pattern formation has been expected. As described above, according to the present embodiment, photomasks good in flatness were produced. The manufacturing yield of semiconductor products such as DRAMs manufactured using such photomasks increases significantly in comparison with the case where the conventional technique is used.

As described above, according to the present embodiment, a photomask good in flatness can be provided. Accordingly, the margin for the depth of focus at wafer exposure time increases remarkably, allowing the manufacturing yield of semiconductor devices, such as DRAMs, to be increased significantly.

[Second Embodiment]

The second embodiment of the present invention is a modification of the first embodiment and relates to a method of manufacturing a photomask. More specifically, the second embodiment relates to a photomask manufacturing method which allows the amount of warping of a mask substrate after mask pattern formation to be controlled to within a desired amount. In the second embodiment, corresponding components to those in the first embodiment are denoted by like reference numerals and detailed descriptions thereof are omitted.

Figure 5:
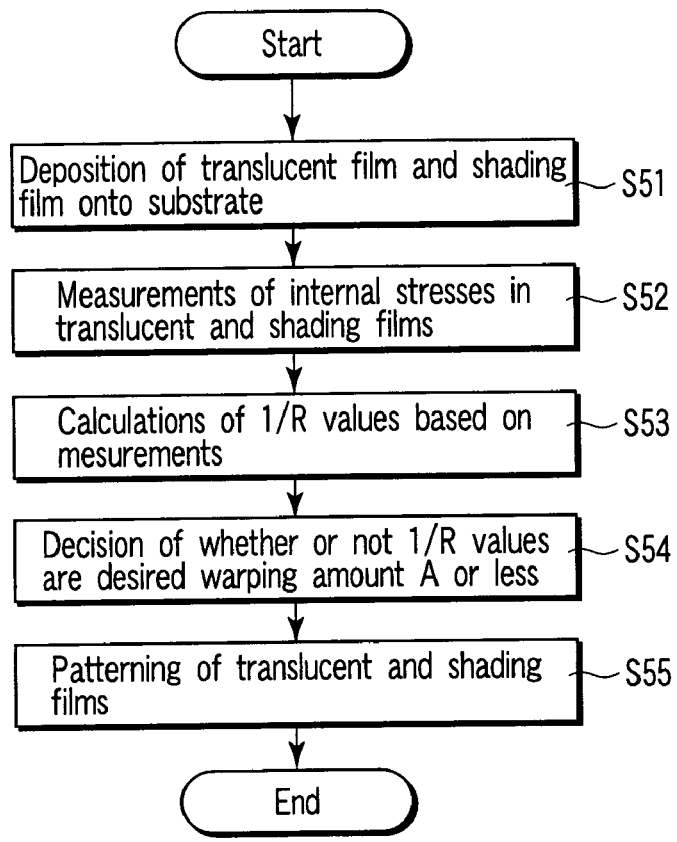
FIG. 5 is a flowchart illustrating a method of manufacture of a photomask according to a second embodiment of the present invention.

Hereinafter, the photomask manufacturing method according to the second embodiment will be described with reference to a flowchart shown in FIG. 5.

First, on the surface of a quartz substrate 1 which is 152 mm on a side and about 6 mm in thickness, a translucent film 2 made of MoSi is deposited at a thickness of, say, 95 nm by means of sputtering. Next, a shading film 3 made of Cr is deposited on the translucent film 2 at a thickness of, say, 59 nm by means of sputtering (S51). Thereby, a half-tone mask blank is formed which is the stacked structure of the quartz substrate 1, the translucent film 2 and the shading film 3.

In the sputtering process of Cr, the Ar gas pressure is set to $P_1$, to $P_5$. Here, $P_1$=7 mTorr, $P_2$=8 mTorr, $P_3$=13 mTorr, $P_4$=18 mTorr, and $P_5$=20 mTorr. Thus, five types of half-tone mask blanks are produced according to five levels of Ar gas pressure at the Cr sputtering. The internal stress in each of the translucent film 2 and the shading film 3 is measured using X-ray diffraction techniques (S52). The interplanar spacing of each of the MoSi and Cr films is measured by X-ray diffraction. Calculations of the internal stress using the $\sin^2 \phi$ method showed that the internal stress in the MoSi film was 1400 GPa in the direction of compression for all of the five types of mask blanks and the internal stress in the Cr film was 500 MPa, 1050 MPa, 2750 MPa, 4400 MPa, and 5000 MPa in the direction of tension for the five types of mask blanks.

Next, the 1/R values are calculated (S53). Specifically, the resultant internal stresses in the translucent film 2 and the shading film 3 and a virtual covering rate h after mask pattern formation are substituted into equation (1) described in the first embodiment. The Young's moduli of the quartz substrate 1, the translucent film 2 and the shading film 3 are 73 GPa, 275 GPa, and 255 GPa, respectively. The values for 1/R were calculated based on equation (1) for each of the five types of mask blanks. The calculations are indicated in Tables 3 and 4 below.

TABLE 3

| Shading film Ar gas pressure (mTorr) | MoSi film Young's modulus (GPa) | Thickness (nm) | Internal stress (MPa) | Cr film Young's modulus (GPa) | Thickness (nm) | Internal stress (MPa) | Virtual covering rate | 1/R (calculated value) (m$^{-1}$) | Decision result ≦ 1.4 × 10$^{-4}$ | Decision result ≦ 0.87 × 10$^{-4}$ |
|---|---|---|---|---|---|---|---|---|---|---|
| $P_1$ = 7 | 275 | 95 | −1400 | 255 | 59 | 500 | 0.3 | −1.33 × 10$^{-4}$ | ○ | x |
| | 275 | 95 | −1400 | 255 | 59 | 500 | 0.4 | −1.54 × 10$^{-4}$ | x | x |
| | 275 | 95 | −1400 | 255 | 59 | 500 | 0.5 | −1.75 × 10$^{-4}$ | x | x |
| | 275 | 95 | −1400 | 255 | 59 | 500 | 0.6 | −1.96 × 10$^{-4}$ | x | x |
| | 275 | 95 | −1400 | 255 | 59 | 500 | 0.7 | −2.17 × 10$^{-4}$ | x | x |
| | 275 | 95 | −1400 | 255 | 59 | 500 | 0.8 | −2.38 × 10$^{-4}$ | x | x |
| | 275 | 95 | −1400 | 255 | 59 | 500 | 0.9 | −2.59 × 10$^{-4}$ | x | x |
| | 275 | 95 | −1400 | 255 | 59 | 500 | 1 | −2.80 × 10$^{-4}$ | x | x |
| $P_2$ = 8 | 275 | 95 | −1400 | 255 | 59 | 1050 | 0.3 | −8.51 × 10$^{-5}$ | ○ | ○ |
| | 275 | 95 | −1400 | 255 | 59 | 1050 | 0.4 | −1.06 × 10$^{-4}$ | ○ | x |
| | 275 | 95 | −1400 | 255 | 59 | 1050 | 0.5 | −1.27 × 10$^{-4}$ | ○ | x |
| | 275 | 95 | −1400 | 255 | 59 | 1050 | 0.6 | −1.48 × 10$^{-4}$ | x | x |
| | 275 | 95 | −1400 | 255 | 59 | 1050 | 0.7 | −1.69 × 10$^{-4}$ | x | x |
| | 275 | 95 | −1400 | 255 | 59 | 1050 | 0.8 | −1.90 × 10$^{-4}$ | x | x |
| | 275 | 95 | −1400 | 255 | 59 | 1050 | 0.9 | −2.11 × 10$^{-4}$ | x | x |
| | 275 | 95 | −1400 | 255 | 59 | 1050 | 1 | −2.32 × 10$^{-4}$ | x | x |
| $P_3$ = 13 | 275 | 95 | −1400 | 255 | 59 | 2750 | 0.3 | 6.35 × 10$^{-5}$ | ○ | ○ |
| | 275 | 95 | −1400 | 255 | 59 | 2750 | 0.4 | 4.25 × 10$^{-5}$ | ○ | ○ |
| | 275 | 95 | −1400 | 255 | 59 | 2750 | 0.5 | 2.15 × 10$^{-5}$ | ○ | ○ |
| | 275 | 95 | −1400 | 255 | 59 | 2750 | 0.6 | 5.55 × 10$^{-7}$ | ○ | ○ |
| | 275 | 95 | −1400 | 255 | 59 | 2750 | 0.7 | −2.04 × 10$^{-5}$ | ○ | ○ |
| | 275 | 95 | −1400 | 255 | 59 | 2750 | 0.8 | −4.14 × 10$^{-5}$ | ○ | ○ |
| | 275 | 95 | −1400 | 255 | 59 | 2750 | 0.9 | −6.24 × 10$^{-5}$ | ○ | ○ |
| | 275 | 95 | −1400 | 255 | 59 | 2750 | 1 | −8.33 × 10$^{-5}$ | ○ | ○ |

TABLE 4

| Shading film Ar gas pressure (mTorr) | MoSi film Young's modulus (GPa) | Thickness (nm) | Internal stress (MPa) | Cr film Young's modulus (GPa) | Thickness (nm) | Internal stress (MPa) | Virtual covering rate | 1/R (calculated value) (m$^{-1}$) | Decision result ≦ 1.4 × 10$^{-4}$ | Decision result ≦ 0.87 × 10$^{-4}$ |
|---|---|---|---|---|---|---|---|---|---|---|
| $P_4$ = 18 | 275 | 95 | −1400 | 255 | 59 | 4400 | 0.3 | 2.08 × 10$^{-4}$ | x | x |
| | 275 | 95 | −1400 | 255 | 59 | 4400 | 0.4 | 1.87 × 10$^{-4}$ | x | x |
| | 275 | 95 | −1400 | 255 | 59 | 4400 | 0.5 | 1.66 × 10$^{-4}$ | x | x |
| | 275 | 95 | −1400 | 255 | 59 | 4400 | 0.6 | 1.45 × 10$^{-4}$ | x | x |
| | 275 | 95 | −1400 | 255 | 59 | 4400 | 0.7 | 1.24 × 10$^{-4}$ | ○ | x |
| | 275 | 95 | −1400 | 255 | 59 | 4400 | 0.8 | 1.03 × 10$^{-4}$ | ○ | x |
| | 275 | 95 | −1400 | 255 | 59 | 4400 | 0.9 | 8.19 × 10$^{-5}$ | ○ | ○ |
| | 275 | 95 | −1400 | 255 | 59 | 4400 | 1 | 6.09 × 10$^{-5}$ | ○ | ○ |
| $P_5$ = 20 | 275 | 95 | −1400 | 255 | 59 | 5000 | 0.3 | 2.60 × 10$^{-4}$ | x | x |
| | 275 | 95 | −1400 | 255 | 59 | 5000 | 0.4 | 2.39 × 10$^{-4}$ | x | x |
| | 275 | 95 | −1400 | 255 | 59 | 5000 | 0.5 | 2.18 × 10$^{-4}$ | x | x |
| | 275 | 95 | −1400 | 255 | 59 | 5000 | 0.6 | 1.97 × 10$^{-4}$ | x | x |

TABLE 4-continued

| Shading film Ar gas pressure (mTorr) | MoSi film | | | Cr film | | | Virtual covering rate | 1/R (calculated value) (m$^{-1}$) | Decision result ≦ 1.4 × 10$^{-4}$ | Decision result ≦ 0.87 × 10$^{-4}$ |
|---|---|---|---|---|---|---|---|---|---|---|
| | Young's modulus (GPa) | Thickness (nm) | Internal stress (MPa) | Young's modulus (GPa) | Thickness (nm) | Internal stress (MPa) | | | | |
| | 275 | 95 | −1400 | 255 | 59 | 5000 | 0.7 | 1.76 × 10$^{-4}$ | x | x |
| | 275 | 95 | −1400 | 255 | 59 | 5000 | 0.8 | 1.55 × 10$^{-4}$ | x | x |
| | 275 | 95 | −1400 | 255 | 59 | 5000 | 0.9 | 1.34 × 10$^{-4}$ | ○ | x |
| | 275 | 95 | −1400 | 255 | 59 | 5000 | 1   | 1.13 × 10$^{-4}$ | ○ | x |

Next, decisions are made as to whether or not the |1/R| values for the five types of mask blanks are within the range of the desired warping amount A (m$^{-1}$) (A: the predicted amount of warping) after mask pattern formation (S54). The desired warping amount A can be set freely according to the required accuracy of pattern dimensions. In the present embodiment, decisions were made as to whether or not the |1/R| values were 1.4×10$^{-4}$(m$^{-1}$) or less corresponding to the 0.13 μm rule on wafer and 0.87×10$^{-4}$(m$^{-1}$) or less corresponding to the 0.10 μm rule on wafer. The virtual covering rate h was set in the range of 30 to 100%. Specifically, h was set to 30, 40, 50, 60, 70, 80, 90, and 100%. With a photomask for which h=100%, the pattern formed area 4 is fully covered with the translucent film 2. Although such a photomask is not used in actual pattern exposure, the |1/R| values in the case of h=100% were calculated for comparison.

The results in the decision step are also indicated in Tables 3 and 4. That is, the results of decisions in the case where the desired warping amount A is 1.4×10$^{-4}$(m$^{-1}$) or less and the results of decisions in the case where the desired warping amount A is 0.87×10$^{-4}$(m$^{-1}$) or less are indicated. With the mask blanks that are marked ○ in Tables 3 and 4, it is expected that the |1/R| values will fall within the range of the desired warping amount after mask pattern formation. For the others, it is expected that the |1/R| values will go beyond the desired warping amount after mask pattern formation.

As shown in Tables 3 and 4, it can be decided that, with the mask blanks in which the internal stress in the Cr shading film 3 is 500 MPa, the photomask warping amount after mask pattern formation becomes 1.4×10$^{-4}$(m$^{-1}$) or less when the covering rate by the translucent film 2 is 30%. With the mask blanks in which the internal stress in the Cr shading film 3 is 1050 MPa, it can be decided that the photomask warping amount after mask pattern formation becomes 1.4×10$^{-4}$(m$^{-1}$) or less when the covering rate by the translucent film 2 is in the range of 30 to 50%. With the mask blanks in which the internal stress in the Cr shading film 3 is 2750 MPa, it can be decided that the photomask warping amount after mask pattern formation becomes 1.4×10$^{-4}$(m$^{-1}$) or less when the covering rate by the translucent film 2 is in the range of 30 to 100%. With the mask blanks in which the internal stress in the Cr shading film 3 is 4400 MPa, it can be decided that the photomask warping amount after mask pattern formation becomes 1.4×10$^{-4}$(m$^{-1}$) or less when the covering rate by the translucent film 2 is in the range of 70 to 100%. With the mask blanks in which the internal stress in the Cr shading film 3 is 5000 MPa, it can be decided that the photomask warping amount after mask pattern formation becomes 1.4×10$^{-4}$(m$^{-1}$) or less when the covering rate by the translucent film 2 is in the range of 90 to 100%.

From these it will be understood that, if the internal stress of the Cr shading film 3 at room temperature is in the range of 500 MPa to 5 GPa, the choice of mask patterns allows |1/R|≦1.4×10$^{-4}$ and a flatness of 0.8 μm or less to be realized.

Furthermore, with the mask blanks in which the internal stress in the Cr shading film 3 is 1050 MPa, it can be decided that the photomask warping amount after mask pattern formation becomes 0.87×10$^{-4}$(m$^{-1}$) or less when the covering rate by the translucent film 2 is 30%. With the mask blanks in which the internal stress in the Cr shading film 3 is 2750 MPa, it can be decided that the photomask warping amount after mask pattern formation becomes 0.87×10$^{-4}$(m$^{-1}$) or less when the covering rate by the translucent film 2 is in the range of 30 to 100%. With the mask blanks in which the internal stress in the Cr shading film 3 is 4400 MPa, it can be decided that the photomask warping amount after mask pattern formation becomes 0.87×10$^{-4}$(m$^{-1}$) or less when the covering rate by the translucent film 2 is in the range of 90 to 100%.

From these it will be understood that, if the internal stress of the Cr shading film 3 at room temperature is in the range of 1000 MPa to 4500 MPa, the choice of mask patterns allows |1/R|≦0.87×10$^{-4}$ and a flatness of 0.5 μm or less to be realized.

Next, patterning is performed on the half-tone mask blanks with the Cr films by means of lithographic techniques (S55). This patterning process corresponds to the process shown in FIGS. 2A, 2B and 2C. Thereby, photomasks formed with desired mask patterns are finished. At this point, the translucent film 2 and the shading film 3 are selectively removed so that the resultant mask patterns have covering rates for which the warping amount has been decided to be the desired value or less in step S54. This obviates the necessity of producing photomasks such that the warping amount exceeds the desired amount, allowing the photomask manufacturing yield to be increased.

Specifically, for mask blanks in which the internal stress of the Cr shading film 3 is 2750 MPa, mask patterns in which the covering rates by the translucent film 2 are 30, 50, 70, and 90% were formed. For mask blanks in which the internal stress of the Cr shading film 3 is 1050 MPa, mask patterns in which the covering rates by the translucent film 2 are 30 and 50% were selectively formed. For mask blanks in which the internal stress of the Cr shading film 3 is 500 MPa, a mask pattern in which the covering rate by the translucent film 2 is 30% was selectively formed. For mask blanks in which the internal stress of the Cr shading film 3 is 4400 MPa, mask patterns in which the covering rates by the translucent film 2 are 70 and 90% were selectively formed. For mask blanks in which the internal stress of the Cr shading film 3 is 5000 MPa, a mask pattern in which the covering rate by the translucent film 2 is 90% was selectively formed.

Specifically, in the lithography process, a layer of positive chemically amplified resist is coated onto the surface of each of the mask blanks, i.e., onto the surface of the shading film 3, at a thickness of 500 nm. Using an electron beam lithography system having an acceleration voltage of 50 keV, patterns were then drawn on the resist layers of the mask blanks. After the pattern drawing, the mask blanks were baked for 15 min at 110° C. and then spray developed with an alkaline developer solution, whereby resist patterns were formed on the surfaces of the mask blanks.

Next, using the resist patterns as etching masks, both the shading film 3 and the translucent film 2 were etched by means of reactive ion etching techniques. As the etching gas use was made of a mixture of chlorine and oxygen gases. After that, the resist layers were stripped off the mask blank surfaces by ashing equipment and the masks were then cleaned by a cleaning machine. Next, the shading film 3 in the pattern formed area of each mask blank was etched away by means of wet etching. Thus, half-tone phase shifting masks were produced.

The warping amount and the flatness of each of the photomask thus produced were measured by an optical interferometer. The measurements are indicated in Table 5 below.

exposure time and improving significantly the manufacturing yield of semiconductor devices such as DRAMs. Of the photomasks produced in accordance with the present embodiment, the following masks (1), (2) and (3) are 0.5 μm or less in flatness.

(1) A photomask having a pattern of the translucent film 2 formed at a covering rate of 30% on a mask blank in which the internal stress in the Cr shading film is 1050 MPa.

(2) Photomasks having patterns of the translucent film 2 formed at covering rates of 30, 50, 70 and 90% on mask blanks in which the internal stress in the Cr shading film is 2750 MPa.

(3) A photomask having a pattern of the translucent film 2 formed at a covering rate of 90% on a mask blank in which the internal stress in the Cr shading film is 4400 MPa.

Therefore, the margin for the depth of focus at wafer exposure time increases considerably, and the manufacturing yield of semiconductor devices, such as DRAMs, which have fine patterns in the 0.10 μm design rule on wafer increases significantly.

Using photomasks produced in the above manner, electronic products can be fabricated in accordance with such steps as shown in FIGS. 3A to 3F in the first embodiment.

TABLE 5

| MoSI film | | | Cr film | | | | Warping amount | Flatness |
|---|---|---|---|---|---|---|---|---|
| Young's modulus (GPa) | Thickness (nm) | Internal stress (MPa) | Young's modulus (GPa) | Thickness (nm) | Internal stress (MPa) | Covering rate | (measured value) ($m^{-1}$) | (measured value) (μm) |
| 275 | 95 | −1400 | 255 | 59 | 500 | 0.3 | $-1.3 \times 10^{-4}$ | 0.77 |
| 275 | 95 | −1400 | 255 | 59 | 1050 | 0.3 | $-8.5 \times 10^{-5}$ | 0.49 |
| 275 | 95 | −1400 | 255 | 59 | 1050 | 0.5 | $-1.3 \times 10^{-4}$ | 0.73 |
| 275 | 95 | −1400 | 255 | 59 | 2750 | 0.3 | $6.3 \times 10^{-5}$ | 0.37 |
| 275 | 95 | −1400 | 255 | 59 | 2750 | 0.5 | $2.2 \times 10^{-5}$ | 0.12 |
| 275 | 95 | −1400 | 255 | 59 | 2750 | 0.7 | $-2.0 \times 10^{-5}$ | 0.12 |
| 275 | 95 | −1400 | 255 | 59 | 2750 | 0.9 | $-6.2 \times 10^{-5}$ | 0.36 |
| 275 | 95 | −1400 | 255 | 59 | 4400 | 0.7 | $1.2 \times 10^{-4}$ | 0.77 |
| 275 | 95 | −1400 | 255 | 59 | 4400 | 0.9 | $8.2 \times 10^{-5}$ | 0.47 |
| 275 | 95 | −1400 | 255 | 59 | 5000 | 0.9 | $1.3 \times 10^{-4}$ | 0.78 |

As can be seen, the warping amount was below $1.4 \times 10^{-4} (m^{-1})$ for all the photomasks. Thus, it becomes possible to select mask blanks the warping amount of which after mask pattern formation becomes a desired amount or less. That is, it becomes possible to predict the warping amount of a photomask after pattern formation before it is finished, allowing the mask production yield to be increased significantly.

Heretofore, there has been no means for predicting the warping amount of a photomask after mask pattern formation. Therefore, the mask warping amount has had to be measured after mask pattern formation in order to make a decision of whether or not it is in the range of a desired amount. For photomasks in which the warping amount is too large to be used, the mask formation process has been in vain. The manufacturing cost of mask blanks up to the mask pattern formation is several hundreds of thousands of yen, while the mask pattern formation costs several millions of yen. The present embodiment has allowed the mask manufacturing cost to be reduced greatly.

The photomasks produced in accordance with the present embodiment are 0.8 μm or less in flatness, thus increasing considerably the margin for the depth of focus at wafer The calculation of the 1/R values in step S53 and the decision in step S54 may be made manually by humans or automatically by a computer.

Figure 6:
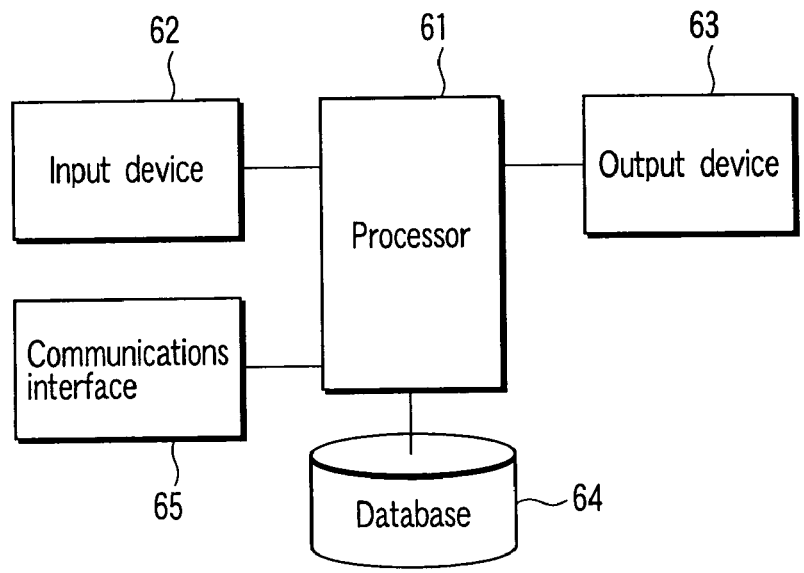
FIG. 6 shows a computer system used in manufacturing a photomask according to a modification of the second embodiment.

For automatic calculation and decision, such a computer system as shown in FIG. 6 can be used. This computer system is constructed from a processor 61, an input device 62, an output device 63, a database 64, and a communications interface 65. The input device 62, the output device 63, the database 64 and the communications interface 65 are connected to the processor 61. The processor 61 is implemented by a CPU by way of example.

The measurements in step S52 are entered into the computer system by an operator through the input device 62 including a keyboard and a mouse. The processor 61 reads the equation (1) from the database 64 and automatically calculates a value for 1/R. The absolute value of the 1/R value thus obtained is compared in the processor 61 with a desired amount A of warping. The warping amount A may be input through the input device 62. When |1/R| is less than the desired warping amount A, the output device 63, such as a CRT, outputs the decision that the flatness is less than a desired value. Thus, automatic prediction of the warping amounts of photomasks is made possible. Data entered through the input device 62 and data stored in the database 64 may be received from the outside through the communications interface 65.

A program which allows the processor 61 to carry out the automatic processing may be recorded on a recording medium. In that case, a recording medium reading apparatus connected to the processor 61 will read the program from the recording medium to cause the processor 61 to carry out the automatic decision processing.

The present invention is not limited to the embodiments described above.

Although the embodiments have been described as the substrate 1, the translucent film 2 and the shading film 3 being made of quartz, MoSi and Cr, respectively, other materials may be also applicable to the photomasks. For example, although the translucent film 2 used in the embodiments is about 6% in light transmittance, this is not restrictive. It is only required that the translucent film 2 be higher than the shading film 3 and lower than the substrate 1 in light transmittance.

Although the embodiments have been described as using the inventive photomasks in manufacturing semiconductor devices, they can be used in manufacturing electronic products other than semiconductor devices.

The method of manufacturing the photomask of the present embodiments is not limited to the process shown in FIGS. 2A, 2B and 2C. For example, in the step shown in FIG. 2C or in the subsequent step, trenches of a desired depth may be formed into the surface of the quartz substrate 1which is exposed as the result of the shading film 3 and the translucent film 2 being removed. This allows the phase of light passed through the transmission portions 4a and the phase of light passed through the semitransmission portions 4b to be controlled.

According to the present embodiment, as described above, a photomask having a desired flatness can be provided.

Additional advantages and modifications will readily occur to those skilled in the art. Therefore, the invention in its broader aspect is not limited to the specific details and representative embodiments shown and described herein. Accordingly, various modifications may be made without departing from the spirit or scope of the general inventive concept as defined by the appended claims and their equivalents.

What is claimed is:

1. A photomask comprising:
    a substrate;
    a translucent film selectively formed on the substrate; and
    a shading film selectively formed on the translucent film, wherein
    when the substrate, the translucent film and the shading film have Young's moduli (MPa) $E_0$ $E_1$ and $E_2$, and film thickness (m) $d_0$, $d_1$ and $d_2$ respectively, internal stresses (MPa) of the translucent film and the shading film at room temperature are $s_1$ and $s_2$ respectively, a covering rate by the translucent film defined by an area in which the shading film is not formed is expressed as h, and coefficients are expressed as $k_1=1.3\times10^{-8}$, $k_2=-9.5\times10^{-2}$, $k_3=6.0\times10^{-7}$, and $k_4=-5.2\times10^{-2}$ respectively, the substrate, the translucent film and the shading film satisfy a condition given by the following expression:

$$\left| \frac{1}{E_0 \cdot d_0} \cdot \left\{ h \cdot \left( k_1 \cdot \frac{S_1}{E_1 \cdot d_1} + k_2 \right) + \left( k_3 \cdot \frac{S_2}{E_2 \cdot d_2} + k_4 \right) \right\} \right| \leq 1.4 \times 10^{-4} (m^{-1}).$$

2. A photomask according to claim 1, wherein the internal stress of the shading film at room temperature is in the range of 500 MPa to 5 GPa.

3. A photomask according to claim 1, wherein the substrate, the translucent film and the shading film satisfy a condition given by the following expression:

$$\left| \frac{1}{E_0 \cdot d_0} \cdot \left\{ h \cdot \left( k_1 \cdot \frac{S_1}{E_1 \cdot d_1} + k_2 \right) + \left( k_3 \cdot \frac{S_2}{E_2 \cdot d_2} + k_4 \right) \right\} \right| \leq 0.87 \times 10^{-4} (m^{-1})$$

4. A photomask according to claim 3, wherein the internal stress of the shading film at room temperature is in the range of 1 GPa to 4.5 GPa.

5. A photomask according to claim 1, wherein the covering rate h is 100%>h≧30%.

6. A photomask according to claim 1, wherein the substrate, the translucent film and the shading film are made of quartz, MoSiON and Cr, respectively.

7. A photomask according to claim 1, wherein a first phase of light that passes through a first area in which the translucent film and the shading film are not formed differs from a second phase of light that passes through a second area in which the translucent film is formed.

8. A method of manufacturing a photomask comprising:
    forming a translucent film and a shading film sequentially onto a surface of a substrate;
    measuring an internal stress in each of the translucent film and the shading film;
    determining whether or not a following expression is satisfied when the substrate, the translucent film and the shading film have Young's moduli (MPa) $E_0$ $E_1$ and $E_2$, and film thickness (m) $d_0$, $d_1$ and $d_2$ respectively, internal stresses (MPa) of the translucent film and the shading film at room temperature are $s_1$ and $s_2$ respectively, a virtual covering rate by the translucent film after mask pattern formation defined by an area in which the shading film is not formed is expressed as h, coefficients are expressed as $k_1=1.3\times10^{-8}$, $k_2=-9.5\times10^{-2}$, $k_3=6.0\times10^{-7}$, and $k_4=-5.2\times10^{-2}$ respectively, and a predicted warping amount for a desired photomask after the mask pattern formation is defined as A (m$^{-1}$); and $$\left| \frac{1}{E_0 \cdot d_0} \cdot \left\{ h \cdot \left( k_1 \cdot \frac{S_1}{E_1 \cdot d_1} + k_2 \right) + \left( k_3 \cdot \frac{S_2}{E_2 \cdot d_2} + k_4 \right) \right\} \right| \leq A(m^{-1})$$

removing the translucent film and the shading film selectively to be the covering rate h that satisfy the expression based on a result of the determining.

9. A method of manufacturing a photomask according to claim 8, wherein the predicted warping amount A is $1.4\times10^{-4}$ (m$^{-1}$).

10. A method of manufacturing a photomask according to claim 9, wherein the internal stress of the shading film at room temperature is in the range of 500 MPa to 5 GPa.

11. A method of manufacturing a photomask according to claim 8, wherein the predicted warping amount A is $0.87\times10^{-4}$(m$^{-1}$).

12. A method of manufacturing a photomask according to claim 11, wherein the internal stress of the shading film at room temperature is in the range of 1 GPa to 4.5 GPa.

13. A method of manufacturing a photomask according to claim 8, wherein the virtual covering rate h is 100%>h≧30%.

14. A method of manufacturing a photomask according to claim 8, wherein a first phase of light that passes through a first area in which the translucent film and the shading film are not formed differs from a second phase of light that passes through a second area in which the translucent film is formed.

15. A method of manufacturing an electronic product comprising:

forming a photoresist on a substrate to be processed;

passing light through a photomask having a mask pattern that has a substrate, a translucent film selectively formed on the substrate and a shading film selectively formed on the translucent film to transfer the mask pattern onto the photoresist; wherein when the substrate, the translucent film and the shading film have Young's moduli (MPa) $E_0$, $E_1$ and $E_2$, and film thickness (m) $d_0$, $d_1$ and $d_2$ respectively, internal stresses (MPa) of the translucent film and the shading film at room temperature are $s_1$ and $s_2$ respectively, a covering rate by the translucent film defined by an area in which the shading film is not formed is expressed as h, and coefficients are expressed as $k_1=1.3\times10^{-8}$, $k_2=-9.5\times10^{-2}$, $k_3=6.0\times10^{-7}$, and $k_4=-5.2\times10^{-2}$ respectively, the substrate, the translucent film and the shading film satisfy a condition given by the following expression:

$$\left| \frac{1}{E_0 \cdot d_0} \cdot \left\{ h \cdot \left( k_1 \cdot \frac{S_1}{E_1 \cdot d_1} + k_2 \right) + \left( k_3 \cdot \frac{S_2}{E_2 \cdot d_2} + k_4 \right) \right\} \right| \leq 1.4 \times 10^{-4} (m^{-1}).$$

developing the photoresist; and selectively processing the substrate to be processed using the photoresist as a mask.

16. A method of manufacturing an electronic product according to claim 15, wherein the internal stress of the shading film at room temperature is in the range of 500 MPa to 5 GPa.

17. A method of manufacturing an electronic product according to claim 15, wherein the substrate, the translucent film and the shading film satisfy a condition given by the following expression:

$$\left| \frac{1}{E_0 \cdot d_0} \cdot \left\{ h \cdot \left( k_1 \cdot \frac{S_1}{E_1 \cdot d_1} + k_2 \right) + \left( k_3 \cdot \frac{S_2}{E_2 \cdot d_2} + k_4 \right) \right\} \right| \leq 0.87 \times 10^{-4} (m^{-1})$$

18. A method of manufacturing an electronic product according to claim 17, wherein the internal stress of the shading film at room temperature is in the range of 1 GPa to 4.5 GPa.

19. A method of manufacturing an electronic product according to claim 15, wherein the covering rate h is 100%>h≦30%.

20. A method of manufacturing an electronic product according to claim 15, wherein a first phase of light that passes through a first area in which the translucent film and the shading film are not formed differs from a second phase of light that passes through a second area in which the translucent film is formed.

* * * * *

UNITED STATES PATENT AND TRADEMARK OFFICE
CERTIFICATE OF CORRECTION

PATENT NO. : 7,097,946 B2  Page 1 of 1
APPLICATION NO. : 10/615194
DATED : August 29, 2006
INVENTOR(S) : Ito et al.

It is certified that error appears in the above-identified patent and that said Letters Patent is hereby corrected as shown below:

Title page, item (57), in the Abstract, line 5, change "$E_0$ $E_1$ and $E_2$," to --$E_0$, $E_1$, and $E_2$,--.

Title page, item (57), in the Abstract, lines 5-6, change "$d_0$, $d_1$ and $d_2$" to --$d_0$, $d_1$, and $d_2$--.

Claim 1, column 15, line 57, change "$E_0$ $E_1$ and $E_2$," to --$E_0$, $E_1$, and $E_2$,--.

Claim 1, column 15, line 58, change "$d_0$, $d_1$ and $d_2$" to --$d_0$, $d_1$, and $d_2$--.

\* Claim 8, column 16, line 38, change "$E_0$ $E_1$ and $E_2$," to --$E_0$, $E_1$, and $E_2$,--.

\* Claim 8, column 16, line 39, change "$d_0$, $d_1$ and $d_2$" to --$d_0$, $d_1$, and $d_2$--.

Claim 15, column 17, line 27, change "$E_0$ $E_1$ and $E_2$," to --$E_0$, $E_1$, and $E_2$,--.

Claim 15, column 17, line 28, change "$d_0$, $d_1$ and $d_2$" to --$d_0$, $d_1$, and $d_2$--.

\* Claim 15, column 18, line 4, after the expression, delete ".".

\* Claim 19, column 18, line 29, change "l00%>h $\leqq$ 30%." to --100%>h $\geqq$ 30%.--.

Signed and Sealed this

Twenty-sixth Day of December, 2006

JON W. DUDAS
*Director of the United States Patent and Trademark Office*